United States Patent [19]

Adair et al.

[11] Patent Number: 4,600,678
[45] Date of Patent: Jul. 15, 1986

[54] IMAGING SYSTEMS EMPLOYING PHOTOSENSITIVE MICROCAPSULES CONTAINING 4-(4'-AMINOPHENYL)-PYRIDINE COMPOUNDS

[75] Inventors: Paul C. Adair; Amy L. Burkholder, both of Chillicothe, Ohio

[73] Assignee: The Mead Corporation, Dayton, Ohio

[21] Appl. No.: 637,258

[22] Filed: Aug. 3, 1984

[51] Int. Cl.$^4$ .......................... G03C 1/00; G03C 1/40; G03C 1/72; G03C 5/00
[52] U.S. Cl. .................................. 430/138; 252/600; 427/213.31; 428/402.2; 428/402.21; 428/402.24; 430/338
[58] Field of Search ................. 430/138, 338; 427/213.31; 428/402.2, 402.21, 404.24; 252/600; 282/27.5

[56] References Cited

U.S. PATENT DOCUMENTS

| | | | |
|---|---|---|---|
| 3,985,376 | 10/1976 | Baumann et al. | 427/150 |
| 4,399,209 | 8/1983 | Sanders et al. | 430/138 |
| 4,440,846 | 4/1984 | Sanders et al. | 430/138 |

Primary Examiner—John Kittle
Assistant Examiner—Mukund J. Shah
Attorney, Agent, or Firm—Biebel, French & Nauman

[57] ABSTRACT

Imaging systems employing photosensitive microcapsules having improved film speed are disclosed wherein the microcapsules contain a 4-(4'-aminophenyl)-pyridine compound in the internal phase as a color former.

8 Claims, No Drawings

IMAGING SYSTEMS EMPLOYING PHOTOSENSITIVE MICROCAPSULES CONTAINING 4-(4'-AMINOPHENYL)-PYRIDINE COMPOUNDS

BACKGROUND OF THE INVENTION

The present invention relates to an improved imaging system of the type employing photosensitive microcapsules.

Imaging systems employing photosensitive microcapsules are described in commonly assigned U.S. Pat. Nos. 4,399,209 and 4,440,836 and commonly assigned U.S. applications Ser. No. 339,917 filed Jan. 18, 1982, and Ser. No. 620,994 filed June 15, 1984. The imaging systems, in their simplest form, comprise an imaging sheet having a layer of photosensitive microcapsules coated on one surface. The internal phase of the microcapsules includes a photosensitive composition and, more particularly, a photocurable composition which cures by free radical addition polymerization. In the most typical embodiments, the internal phase also includes an image-forming agent such as a substantially colorless electron donating color former. Images are formed by image-wise exposing the layer of microcapsules to actinic radiation and subjecting the layer to a uniform rupturing force in the presence of a developer material. U.S. Pat. No. 4,399,209 discloses a transfer imaging system in which the developer material is provided on a support which is separate and distinct from the imaging sheet. After exposing the imaging sheet, it is assembled with the developer carrying sheet and the two are passed together between a pair of pressure rollers with their reactive faces in contact. U.S. Pat. No. 4,440,846 describes a self-contained system in which the developer is provided on the same surface of the support as the photosensitive microcapsules.

U.S. application Ser. Nos. 339,917 and 620,994 describe full color imaging systems in which three sets of microcapsules respectively containing cyan, magenta and yellow color formers are provided on one or separate supports and image-wise exposed using color separation techniques to provide a full color image. In one embodiment, the three sets of the microcapsules have distinct sensitivities such that they can be mixed and exposed on the surface of a single support using, for example, a Dunn or Matrix camera.

While the imaging systems and photosensitive microcapsules described in the aforementioned patents and patent applications are useful in forming images, there is a need for improvement in their film speed.

SUMMARY OF THE INVENTION

The present invention relates to photosensitive microcapsules and an imaging system employing the same having improved film speed.

The imaging system of the present invention is characterized by the fact that the internal phase of the microcapsules comprises a free radical addition polymerizable compound, a photoinitiator such as an aryl ketone, and a 4-(4'-aminophenyl)-pyridine compound, as a color forming agent. It has been found that 4-(4'-aminophenyl)-pyridines enhance the efficiency of the photoinitiator and thereby enhance the film speed of the imaging system. It is believed that the 4-(4'-aminophenyl)-pyridine compound readily transfers a hydrogen atom to the excited photoinitiator and free radicals are thereby formed with higher efficiency.

DEFINITIONS

The term "microcapsule" as used herein includes both microcapsules having a discrete capsule wall as well as so-called open phase systems in which the photosensitive composition is dispersed in a binder.

The term "actinic radiation" as used herein includes the full spectrum of electromagnetic radiation as well as x-ray, ion beam, and gamma radiation. Preferred systems in accordance wih the present invention are sensitive to ultraviolet radiation or blue light (e.g., 350 to 480 nm).

DETAILED DESCRIPTION OF THE INVENTION

The microcapsules and imaging systems of the present invention can be prepared by following the teachings in U.S. Pat. Nos. 4,399,209 and 4,440,846 and U.S. applications Ser. Nos. 339,917 and 620,994 which are incorporated herein by reference.

Representative examples of 4-(4'-aminophenyl)-pyridine compounds useful in the present invention are described in U.S. Pat. No. 3,985,376 to BASF Aktiengesellschaft and can be represented by the formula (I):

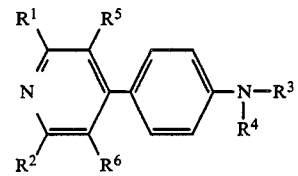

in which $R^1$ and $R^2$ are selected from the group consisting of a hydrogen atom, an alkyl group having one to four carbon atoms, and an aryl group having six to eight carbon atoms which may bear an alkoxy group or a halogen atom as a substituent;

$R^3$ is selected from the group consisting of a hydrogen atom or an alkyl group having one to five carbon atoms;

$R^4$ is selected from the group consisting of an alkyl group, a haloalkyl group, a cyanalkyl group, a aryl group or an aralkyl group having one to eight carbon atoms which may bear an alkoxy group as a substituent;

$R^5$ and $R^6$ are selected from the group consisting of a hydrogen atom or a carboalkoxy group having two to five carbon atoms and $R^3$ and $R^4$ may combine to form a ring.

The following are examples of specific substituents:

for $R^1$ and $R^2$: hydrogen, methyl, ethyl, isopropyl, butyl, phenyl, p-methoxyphenyl, p-ethoxyphenyl, γ-methoxypropyl and p-chlorophenyl, of which hydrogen and phenyl are particularly preferred.

For $R^3$: hydrogen, methyl, ethyl, propyl and butyl, of which methyl, ethyl and n-butyl are preferred.

for $R^4$: methyl, ethyl, propyl, butyl, β-chloroethyl, β-cyanoethyl, phenyl, benzyl, p-methoxyphenyl and p-ethoxyphenyl of which methyl, ethyl, n-propyl and phenyl are preferred;

for $R^5$ and $R^6$ hydrogen, carbomethoxy, carboethoxy, carbopropoxy and carbobutoxy of which hydrogen is preferred.

Particularly preferred color formers are: 2,6-diphenyl-4-(4'-dimethylaminophenyl) pyridine and 2,6-di(4-methoxyphenyl)-4-(4'-dimethylaminophenyl) pyridine.

The 4-(4'-aminophenyl)-pyridines of the formula (I) may be prepared by conventional methods, for example by condensation of 4-(4'-aminophenyl)-pyrylium salts with ammonia or agents which disengage ammonia or by condensation of a 4-aminobenzaldehyde or an arylvinylketone with a ketone in the presence of ammonia or an agent which disengages ammonia.

Compounds of the formula (I) in which there are no substituents in the pyridine nucleus ($R^1$, $R^2$, $R^5$ and $R^6$ being hydrogen) may also be prepared by a conventional method by condensation of an aniline derivative with pyridine in the presence of benzoyl chloride with or without copper powder. Examples of aniline derivatives are: N,N-dimethylaniline, N,N-diethylaniline, N-methyl-N-benzylaniline, N-methyl-N-($\beta$-cyanoethyl)-aniline, and N-methyldiphenylamine.

The 4-(4'-aminophenyl)-pyridines of the formula (I) are pale yellow to colorless compounds. They give intense yellow to orange colorations upon the addition of an acid substance.

Photoinitiators which are useful in the present invention generate free radicals via hydrogen abstraction upon exposure to actinic radiation. Preferred photoinitiators are aryl ketones such as benzophenone, 4,4'-dimethoxybenzophenone; 4,4'-dichlorobenzophenone; 4,4'-bis(dimethylamino)benzophenone; benzanthone; 9-fluorenone; xanthone, 2-methylxanthone; 2-dodecylxanthone; thioxanthone; 2-methylthioxanthone; 2-dodecylthioxanthone; 2-chlorothioxanthone; 2-isopropylthioxanthone, etc. These photoinitiators can be used alone or in combination with other photoinitiators such as 2,2-dimethoxy-2-phenylacetophenone (e.g., Irgacure 651 of Ciba-Geigy); 1-hydroxy cyclohexyl phenyl ketone (e.g., Irgacure 184 of Ciba-Geigy); 2,2-diethoxyacetophenone; hydroxymethylpropane; benzoin akylethers such as benzoin propyl ether and benzoin isobutyl ether.

The particular photoinitiators used are selected based on their spectral sensitivities. The pyridine compounds used as color formers in accordance with the present invention possess a high ultraviolet absorption at wavelengths less than about 380 nm which slows the photographic speed of photoinitiator systems having $\lambda$ max less than 380 nm. Preferred initiators have maximum activity at wavelenghts greater than 380 nm and include thioxanthones, phenanthrenequinones, and ketocoumarins. Benzophenones are less desirable. As a general rule, the photosensitive composition containing the photoinitiator should provide a microcapsule having a sensitivity (E) less than 1,000 ergs/cm$^2$ in the desired exposure range. The term "sensitivity" corresponds to the amount of incident radiation required to produce a first loss in density of 0.10 density units. The photosensitive microcapsules of the present invention are by nature positive working. Consequently, when unexposed the microcapsules rupture and activate the color former which reacts the developer to produce a maximum image density. Thus, the term "sensitivity" represents the minimum exposure necessary to effect a substantive reduction (0.10 density units) in that maximum density.

In a full color imaging system it is often desirable to incorporate an absorber compound such as an ultraviolet absorber in the internal phase to narrow the spectral sensitivity of the microcapsules. Useful absorbers are described in commonly assigned U.S. application Ser. No. 620,994.

The most common examples of materials which are curable by free radical addition polymerization and which are useful in the present invention are ethylenically unsaturated compounds, e.g., compounds containing one or more terminal or pendant vinyl or allylic groups. Such compounds are well known in the art and include acrylic and methacrylic esters of polyhydric alcohols such as trimethylolpropane, pentaerythritol, and the like. Representative examples include ethylene glycol diacrylate, ethylene glycol dimethacrylate, trimethylolpropane triacrylate (TMPTA), pentaerythritol tetraacrylate, pentaerythritol tetramethacrylate, hexanediol-1,6-dimethacrylate, and diethyleneglycol dimethacrylate.

In accordance with one embodiment of the present invention, the radiation sensitive composition may additionally include a polythiol to increase the film speed of the microcapsules.

Useful polythiols include ethylene glycol bis (thioglycolate), ethylene glycol bis ($\beta$-mercaptopropionate), trimethylolpropane tris (thioglycolate), pentaerythritol tetrakis (thioglycolate) and the most preferred pentaerythritol tetrakis ($\beta$-mercaptopropionate) and trimethylolpropane tris ($\beta$-mercaptopropionate), and mixtures thereof. These compounds are commercially available. Certain polymeric polythiols such as polypropylene ether glycol bis ($\beta$-mercaptopropionate) which is prepared by esterification of polypropylene ether glycol may also be useful.

Various oligomers or polymers can also be used in the present invention to improve the film speed of the microcapsules. These materials increase the rate with which the viscosity of the internal phase of the microcapsules builds to a level at which differential release of the internal phase is achieved. These materials must be soluble in the photosensitive composition and not interfere with the photopolymerization reaction. Reactive oligomers contain terminal or pendant ethylenic unsaturation and include urethane, ester and epoxy based reactive acrylate, methacrylate, vinyl and allyl prepolymers. Useful non-reactive oligomers are polymers which are solid or semisolid at room temperature but soluble in the unreacted photosensitive composition. Representative examples of some commercially available oligomers or polymers which are useful in the present invention include reactive materials such as diallyl o-phthalate prepolymer (Polysciences), Uvithane 893 (Morton Thiokol, Inc.), Ebercryl 270 (Virginia Chemicals) and non-reactive materials such as ethyl cellulose, or Lucite.

The color former is incorporated in the internal phase in an amount sufficient to produce a visible image of the desired density upon reaction with a developer or upon transfer. In general, the color former is present in an amount of approximately 0.5 to 20% by weight based on the weight of the internal phase. A preferred range is about 2 to 10% by weight. Transfer imaging materials usually contain about 6% by weight of the color former whereas self-contained materials contain about 1.5 to 3% by weight of the image-forming agent. The relative amounts of the cyan, magenta and yellow color formers in the microcapsules in a full color system are adjusted to provide satisfactory color balance. In conjunction with this, the relative amounts of the microcapsules in the coating composition can be adjusted to improve color balance.

In addition to the photosensitive composition, the internal phase may additionally include a diluent oil. Inclusion of the oil often improves half tone gradation in visual images. Preferred diluent oils are weakly polar solvents having boiling points above 170° C. and preferably in the range of 180 to 300° C. Examples of carrier oils are alkylated biphenyls (e.g., monoisopropylbiphenyl), polychlorinated biphenyls, castor oil, mineral oil, deodorized kerosene, naphthenic mineral oils, dibutyl phthalate, dibutyl fumerate, brominated paraffin and mixtures thereof. Alkylated biphenyls and kerosene are generally less toxic and preferred. The amount of diluent oil incorporated in the microcapsules will depend upon the photographic characteristics that are desired in the photosensitive materials. Typically, the diluent oil is used in an amount of approximately 10 to 20% by weight based on the weight of the internal phase.

The photosensitive microcapsules of the present invention can be formed using known encapsulation techniques. The photosensitive composition and associated agents can be encapsulated in hydrophilic wall-forming materials such as gelatin-type materials (see U.S. Pat. Nos. 2,730,456 and 2,800,457 to Green et al) including gum arabic, polyvinyl alcohol, carboxy-methyl-cellulose; resorcinol-formaldehyde wall formers (see U.S. Pat. No. 3,755,190 to Hart et al); isocyanate wall-formers (see U.S. Pat. No. 3,914,511 to Vassiliades); isocyanatepolyol wall-formers (see U.S. Pat. No. 3,796,669 to Kirintani et al); urea formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al); and melamine-formaldehyde resin and hydroxypropyl cellulose (see commonly assigned U.S. Pat. No. 4,025,455 to Shackle). Urea-formaldehyde microcapsules are preferred for use in the present invention. Methods for producing urea formaldehyde capsules which are particularly useful are described in U.S. Pat. Nos. 4,251,386 and 4,138,362.

The mean size of the microcapsules of the present invention generally ranges from approximately 1 to 25 microns. As a general rule, image resolution improves as capsule size decreases except that if the capsule size is too small, the capsules may disappear in the pore or fiber structure of some substrates.

The microcapsules of the present invention can be used to form either transfer or self-contained imaging systems, i.e., systems in which the developer is on the same or a separate support from the microcapsules. A detailed description of transfer materials can be found in U.S. Pat. No. 4,399,209. Self contained systems are the subject of commonly assigned U.S. Patent 4,440,846.

Illustrative examples of color developers useful with the electron donating type color precursors are clay minerals such as acid clay, active clay, attapulgite, etc.; organic acids such as tannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxy naphthoate, zinc 3,5 di-tert-butyl salicylate, zinc 3-cyclohexyl-5-($\alpha,\alpha$-dimethylbenzyl) salicylate (see U.S. Pat. Nos. 3,864,146 and 3,934,070), oil soluble metal salts or phenol-formaldehyde novolak resins (e.g., see U.S. Pat. Nos. 3,672,935; 3,732,120 and 3,737,410) such as zinc modified oil soluble phenol-formaldehyde resin as disclosed in U.S. Pat. No. 3,732,120, zinc carbonate etc. and mixtures thereof.

The most common substrate for the photosensitive material of this invention is paper. The paper may be a commercial impact raw stock, or a special grade paper such as cast-coated paper or chrome-rolled paper. Transparent substrates such as polyethylene terephthalate and translucent substrates can also be used in this invention.

The present invention is illustrated in more detail by the following non-limiting examples wherein the following procedures were used:

Capsule Preparation

1. Into a 1200 ml stainless steel beaker, 416 g water and 99.2 g isobutylene maleic anhydride copolymer (18%) are weighed.

2. The beaker is clamped in place on a hot plate under an overhead mixer. A six-bladed, 45° pitch, turbine impeller is used on the mixer.

3. After thoroughly mixing, 12.4 g pectin is slowly sifted into the beaker. This mixture is stirred for 20 minutes.

4. The pH is adjusted to 4.0 using a 20% solution of $H_2SO_4$, and 0.4 g Quadrol (2-hydroxypropyl ethylenediamine with propylene oxide from BASF) is added.

5. The mixer is turned up to 3000 rpm and the internal phase is added over a period of 10–15 seconds. Emulsification is continued for 10 minutes.

6. At the start of emulsification, the hot plate is turned up so heating continues during emulsification.

7. After 10 minutes, the mixing speed is reduced to 2000 rpm and 66.4 g urea solution (50% w/w), 3.2 g resorcinol in 20 g water, formaldehyde (37%), and 2.4 g ammonium sulfate in 40 ml water are added at two-minute intervals.

8. The beaker is covered with foil and a heat gun is used to help bring the temperature of the preparation to 65° C. When 65° C. is reached, the hot plate is adjusted to maintain this temperature for a two to three hour cure time during which the capsule walls are formed.

9. After curing, the heat is turned off and the pH is adjusted to 9.0 using a 20% NaOH solution. 10. Dry sodium bisulfite (11.2 g) is added and the capsule preparation is cooled to room temperature.

Imaging Sheet Preparation

Capsule preparations (10 g) obtained as outlined above were mixed with 8 g of 10% Triton X-100 (Rohm & Haas Company) in water and 2 g of 10% Klucel L (Hercules, Inc.) and the resultant mixture was coated on 80 lb Black & White Glossy (The Mead Corporation) with a number 12 wire-wound rod and dried at 90° C. for ½ hour.

Developer Sheet Preparation

A mixture of 852 g water, 250 g 25% Tamol 731 (Rohm & Haas Company), 75 g HT clay, 1000 g KC-11 (a synthetic developer manufactured by Fuji Photo Film Company, Ltd.), 15 g Calgon T (Calgon, Inc.) 30 g Dequest 2006 (Monsanto Co.) was ground to a particle size less than 5 microns. To this mixture was added 25 parts HT clay and 10 parts Dow 501 latex per 65 parts of the mixture. The resultant material was coated with a #10 Meyer bar on 80 lb Black and White Enamel base stock at 30 to 35% solids.

EXAMPLE 1

Imaging sheets were prepared as outlined above using capsules which contained the following internal phases:

| Imaging Sheet A | |
| --- | --- |
| TMPTA | 200 g |
| 7-diethylamino-3-cinamoylcoumarin | 0.4 |
| Quanticure EPD (Ward-Blenkinsop, Ltd.) | 8 g |
| 2,6-diphenyl-4-(4'-dimethyl-aminophenyl)pyridine | 20 g |
| SF-50 | 6.68 g |
| N-100 | 13.32 g |

| Imaging Sheet B | |
| --- | --- |
| TMPTA | 200 g |
| 7-diethylamino-3-cinamoylcoumarin | 0.4 g |
| Quanticure EPD | 8 g |
| Copikem XX (a product of Hilton-Davis Chemical Co.) | 12 g |
| SF-50 | 6.68 g |
| N-100 | 13.32 g |

The Imaging Sheets were exposed with a Kratos 1000W Xenon source equipped with a monochromator (20nm band pass) through a Stauffer step tablet (0.1 density increments) and the resultant image was examined.

The exposure required to attain $D_{10}$ was determined to be 2,600 ergs/cm² at 470 nm for Sheet A as compared to 10,600 ergs/cm² for Sheet B. Experiments have indicated that Copikem XX exhibits no deleterious effect on the photopolymerization. Thus, the 2,6-diphenyl-4-(4'-dimethylaminophenyl)pyridine is seen to enhance the initiation efficiency.

EXAMPLE 2

Imaging sheets were prepared in which the capsules contained the following internal phases:

| Imaging Sheet C | |
| --- | --- |
| TMPTA | 200 g |
| 7-diethylamino-3-thenoylcoumarin | 0.92 g |
| Quanticure EPD | 8 g |
| 2,6-diphenyl-4-(4'-dimethyl-aminophenyl)pyridine | 10 g |
| SF-50 | 6.68 g |
| N-100 | 13.32 g |

| Imaging Sheet D | |
| --- | --- |
| TMPTA | 200 g |
| 7-diethylamino-3-thenoylcoumarin | 0.92 g |
| Quanticure EPD | 8 g |
| Copikem XX | 12 g |
| SF-50 | 6.68 g |
| N-100 | 13.32 g |

The exposure required to attain $D_{10}$ for Imaging Sheet C at 415 nm was 2,500 ergs/cm² while that required for Sheet D was 8,100 ergs/cm². Again, the 2,6-diphenyl-4-(4'-dimethylaminophenyl)pyridine is seen to enhance the initiation efficiency.

Having described the invention in detail and by reference to preferred embodiments thereof, it will be apparent that modifications and variations are possible without departing from the scope of the invention defined in the appended claims.

What is claimed is:

1. An imaging sheet comprising a support having on a surface thereof a layer containing photosensitive microcapsules, said microcapsules including in the internal phase thereof a free radical addition polymerizable material, a photoinitiator, and a color former, wherein said photoinitiator is capable of generating free radicals upon exposure to actinic radiation via hydrogen abstraction and said color former is a 4-(4'-aminophenyl)-pyridine compound which enhances the film speed of said imaging sheet.

2. The imaging sheet of claim 1 wherein said microcapsule has a discrete capsule wall.

3. The imaging sheet of claim 2 wherein said free radical addition polymerizable material is an ethylenically unsaturated compound.

4. The imaging sheet of claim 3 wherein said photoinitiator is an aryl ketone.

5. The imaging sheet of claim 4 wherein said 4-(4'-aminophenyl)-pyridine compound is represented by the formula (I):

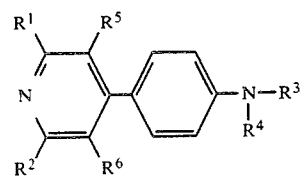

in which
R¹ and R² are the same or different and selected from the group consisting of hydrogen, methyl, ethyl, propyl, butyl, phenyl, p-methoxyphenyl, p-ethoxyphenyl, γ-methoxypropyl and p-chlorophenyl,
R³ is selected from the group consisting of hydrogen, methyl, ethyl, propyl, and butyl;
R⁴ is selected from the group consisting of methyl, ethyl, propyl, butyl, β-chloroethyl, βcyanoethyl, phenyl, benzyl, p-methoxyphenyl and p-ethoxyphenyl, and
R⁵ and R⁶ are the same or different and selected from the group consisting of hydrogen, carbomethoxy, carboethoxy, carbopropoxy and carbobutoxy.

6. The imaging sheet of claim 5 wherein:
R¹ and R² are hydrogen or phenyl;
R³ and R⁴ are methyl, propyl or butyl; and
R⁵ and R⁶ are hydrogen.

7. The imaging sheet of claim 6 wherein said compound is 2,6-diphenyl-4-(4'-dimethylaminophenyl) pyridine.

8. The imaging sheet of claim 5 wherein said aryl ketone has λ max greater than about 380 nm.

* * * * *

UNITED STATES PATENT AND TRADEMARK OFFICE
CERTIFICATE OF CORRECTION

PATENT NO.   :   4,600,678

DATED        :   July 15, 1986

INVENTOR(S)  :   Paul C. Adair and Amy L. Burkholder

It is certified that error appears in the above-identified patent and that said Letters Patent is hereby corrected as shown below:

Column 8, line 54, (Claim 6), after "methyl," insert --ethyl--.

Signed and Sealed this

Tenth Day of February, 1987

Attest:

DONALD J. QUIGG

Attesting Officer

Commissioner of Patents and Trademarks